US006300020B1

United States Patent
Ina et al.

(10) Patent No.: US 6,300,020 B1
(45) Date of Patent: *Oct. 9, 2001

(54) BALL-SHAPED DEVICE EXPOSURE APPARATUS AND BALL-SHAPED DEVICE MANUFACTURING METHOD

(75) Inventors: Hideki Ina, Utsunomiya; Setsuo Minami, Kawasaki, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/041,012

(22) Filed: Mar. 12, 1998

(30) Foreign Application Priority Data

Mar. 12, 1997 (JP) .................................................. 9-057608
Apr. 18, 1997 (JP) .................................................. 9-101761

(51) Int. Cl.⁷ ................................................. H01L 21/027
(52) U.S. Cl. ........................... 430/22; 430/311; 430/396; 355/47; 355/77

(58) Field of Search ..................................... 430/311, 396, 430/22; 355/47, 77, 104, 132

(56) References Cited

U.S. PATENT DOCUMENTS 3,606,231 * 9/1971 Oppenheimer ......................... 355/47
5,344,729 * 9/1994 Akins et al. ............................. 430/5
5,955,776 * 9/1999 Ishikawa ............................. 257/618

FOREIGN PATENT DOCUMENTS 63-23118    1/1988  (JP) .

\* cited by examiner

Primary Examiner—John McPherson
(74) Attorney, Agent, or Firm—Fitzpatrick, Cella, Harper & Scinto

(57) ABSTRACT

A circuit pattern surface curving in correspondence with the surface shape of a ball-like semiconductor device material such as a silicon ball is formed in a reticle. A resist-applied surface of the device material is so exposed as to move the ball-like semiconductor device material close to the circuit pattern surface. In this manner, a circuit pattern is formed on the surface of the ball-like device material.

7 Claims, 18 Drawing Sheets

F I G. 19
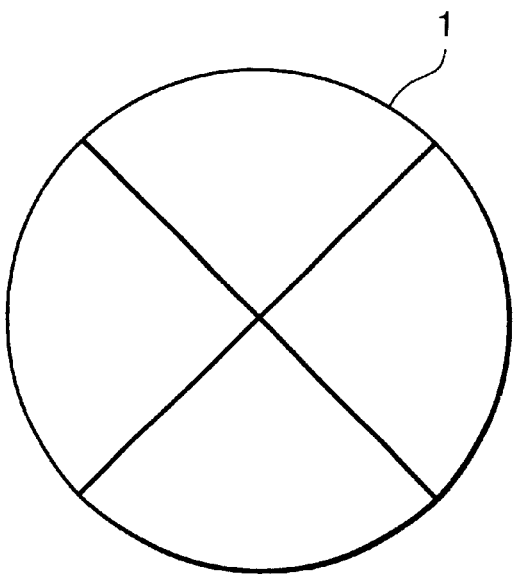
F I G. 20
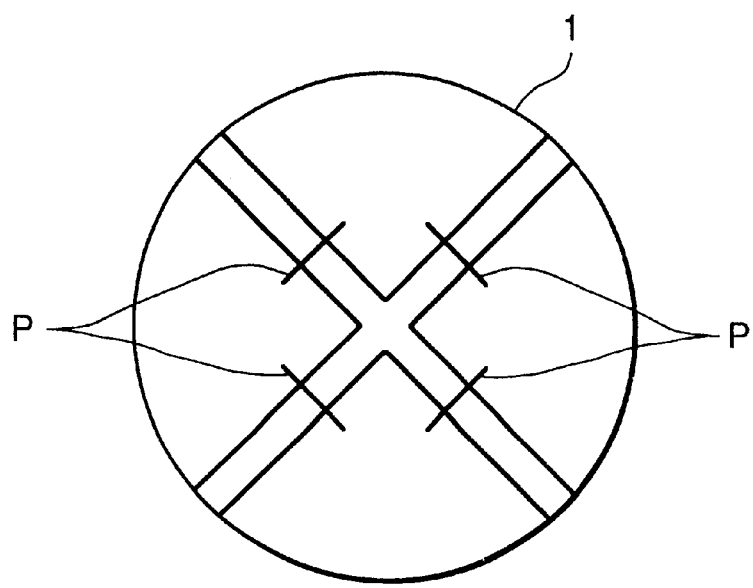

US 6,300,020 B1

BALL-SHAPED DEVICE EXPOSURE APPARATUS AND BALL-SHAPED DEVICE MANUFACTURING METHOD

BACKGROUND OF THE INVENTION

1. Field of the Invention

The present invention relates to a ball-like device exposure apparatus and a ball-like device manufacturing method suitable for devices such as a semiconductor shaped into a ball or part of a ball.

2. Description of the Related Art

Flat silicon wafers have conventionally been known. Recently, ball-like semiconductor devices using silicon balls with a diameter of about 1 mm are proposed.

However, conventional exposure apparatuses and semiconductor device manufacturing methods are provided to manufacture a semiconductor device by exposing a flat silicon wafer, and cannot manufacture a ball-like semiconductor device.

SUMMARY OF THE INVENTION

It is an object of the present invention to provide an exposure apparatus and a ball-like device manufacturing method suitable for exposing a ball-like device.

To achieve the above object, a ball-like device exposure apparatus and manufacturing method according to the present invention are characterized in that a reticle having a circuit pattern surface curving in correspondence with the ball surface of a ball-like device material can be set, and a circuit pattern is exposed on the ball-like device material brought close to the circuit pattern surface of the reticle.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 19 is a view of pattern exposure on the upper semisphere of the silicon ball by four exposure processes without any boundary line; and FIG. 20 is an explanatory view of pattern exposure on the upper semisphere of the silicon ball by four exposure processes with boundary lines, and line connection.

DETAILED DESCRIPTION OF THE PREFERRED EMBODIMENT

Figure 1:
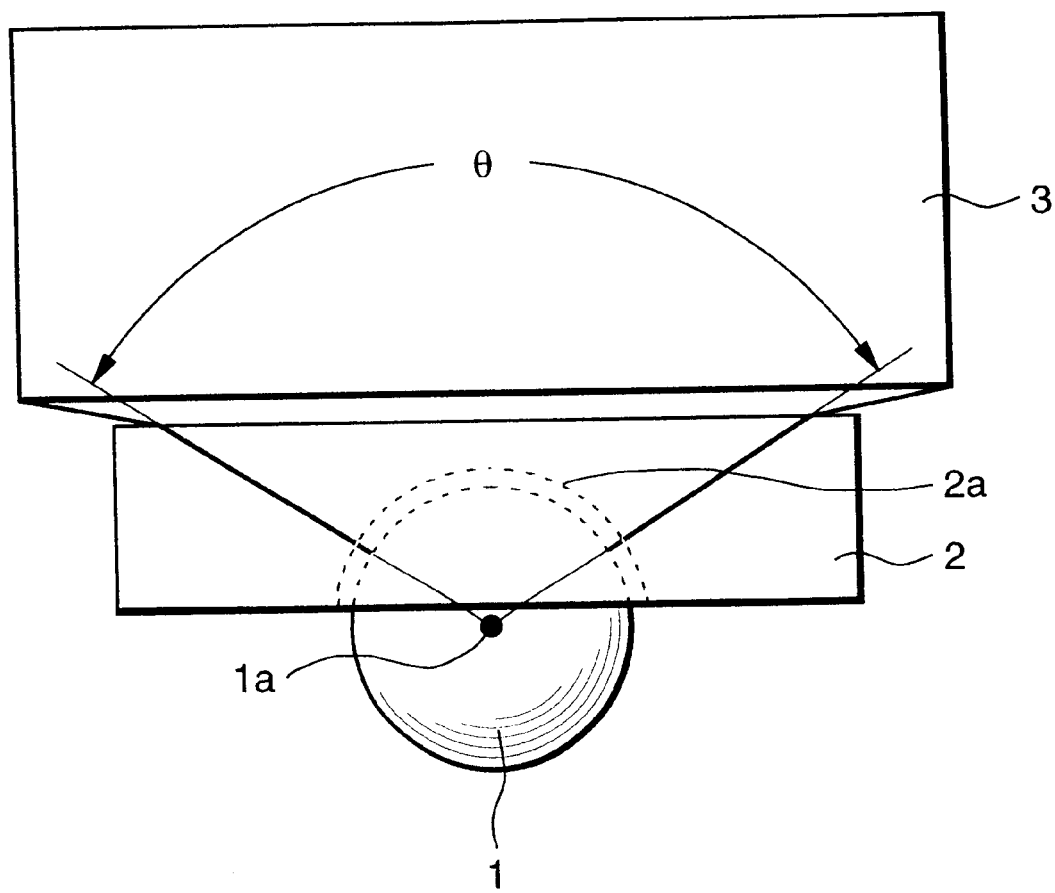
FIG. 1 is a view showing the first embodiment of the present invention.

FIG. 1 is a view showing the first embodiment of the present invention.

In FIG. 1, a circuit pattern surface 2a formed in a reticle 2 is arranged near the ball surface of a silicon ball 1 (with a diameter in mm order, e.g., 1 mm) which is made of silicon and is a ball-like device material coated with a resist film on a surface to be exposed.

In exposure, an illumination light beam incident from an illumination system 3 at a conical angle θ illuminates the circuit pattern surface 2a of the reticle 2.

The illumination light beam illuminates the circuit pattern surface 2a toward a ball center 1a of the silicon ball 1. The surface of the silicon ball 1 is exposed into a pattern drawn on the circuit pattern surface 2a by the light beam passing though the circuit pattern surface 2a.

The circuit pattern surface 2a curves in the form of a ball having the ball center 1a as a center, and faces the silicon ball 1.

Figure 2:
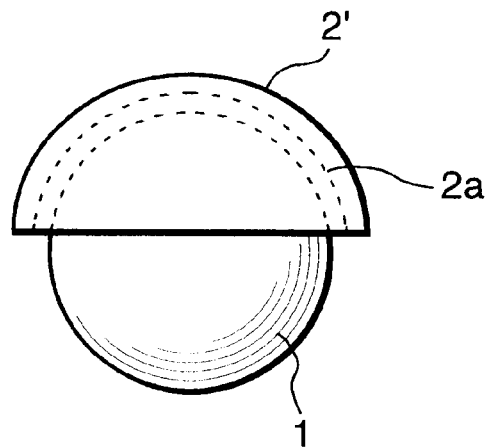
FIG. 2 is a view showing a modification of a reticle.

FIG. 2 shows a reticle 2' used instead of the reticle 2.

The reticle 2 has a flat light incident surface (upper surface). To the contrary, the reticle 2' has a ball-like light incident surface (upper surface), and the center of the ball coincides with the ball center 1a of the silicon ball 1. A circuit pattern surface 2a curving in the form of a ball is arranged near the surface of the silicon ball 1. The circuit pattern surface 2a is shaped into part of a ball, and the center of the ball coincides with the ball center 1a of the silicon ball 1.

Figure 3:
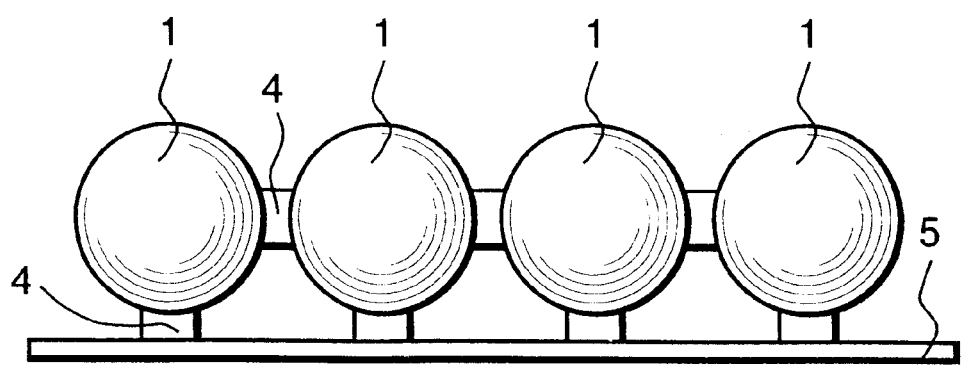
FIG. 3 is a view showing a semiconductor device obtained by connecting a plurality of silicon balls via bumps.

As shown in FIG. 3, a plurality of silicon balls 1 are connected to a power supply line 5 via bumps 4 to constitute a semiconductor device.

In exposure, the silicon ball must be aligned with respect to six axes in the x, y, and z directions and the α, β, and γ directions around the x, y, and z axes.

Figure 4:
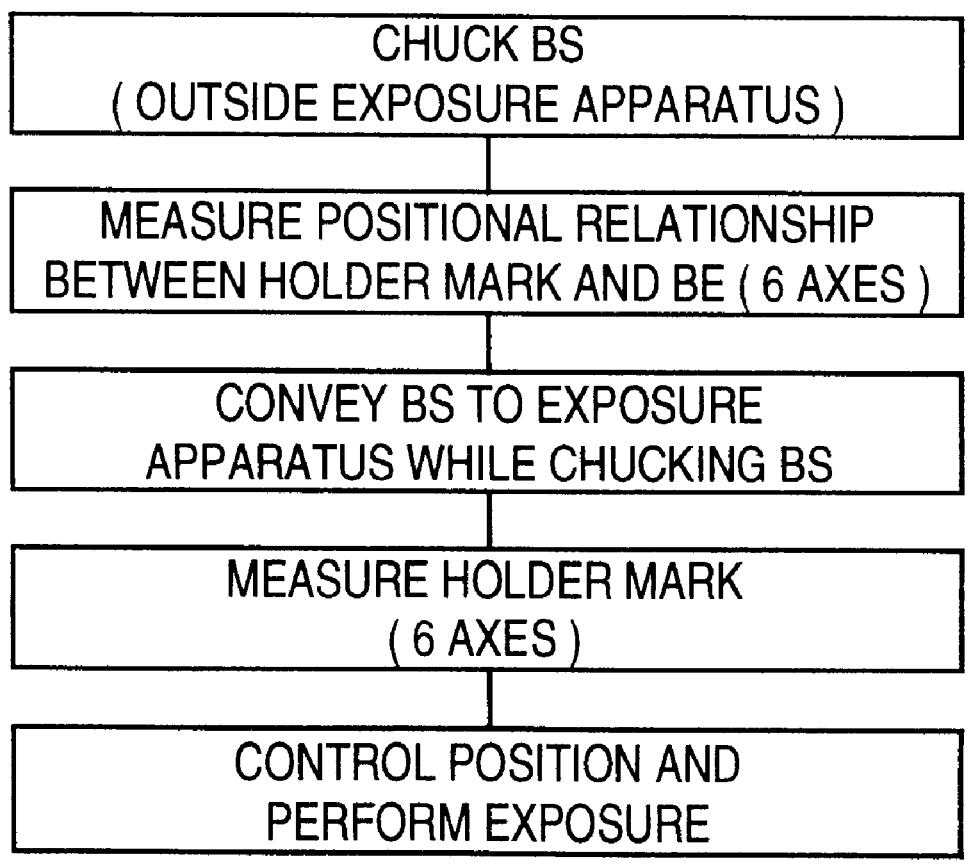
FIG. 4 is a view showing the concept of aligning a holder for chucking the silicon balls with respect to an exposure apparatus.
Figure 9:
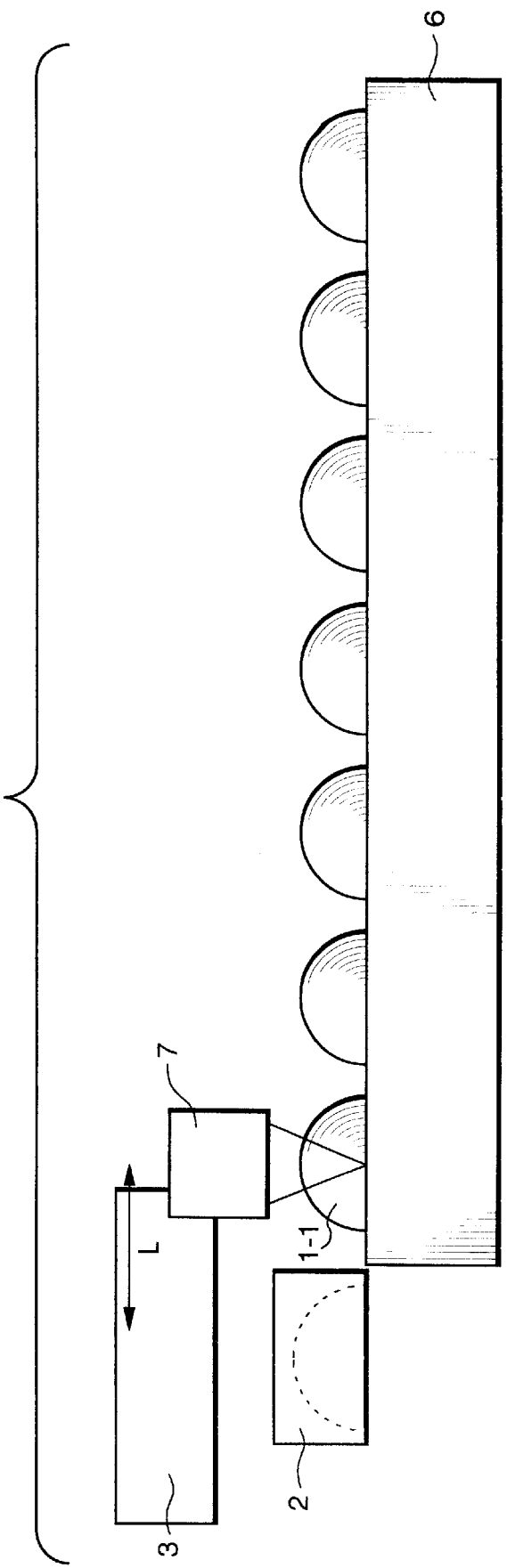
FIG. 9 is a view showing position detection of a portion of the holder near the leftmost silicon ball.

FIG. 4 is a conceptional view of control of moving a holder for holding a silicon ball (to be referred to as a BS in FIG. 4) in exposing the silicon ball. The silicon ball (BS) is held by the holder with a predetermined positional relationship (this positional relationship is measured outside the exposure apparatus and stored in advance). The holder is conveyed to the exposure apparatus. As shown in FIG. 9 (to be described later), the position of the holder with respect to the exposure apparatus is measured for the six axes using position detection marks of the holder. On the basis of the two measurement results, i.e., the positional relationship between the silicon ball and the holder and the positional relationship between the holder and the exposure apparatus, the silicon ball is aligned and exposed by the exposure apparatus.

Figure 5:
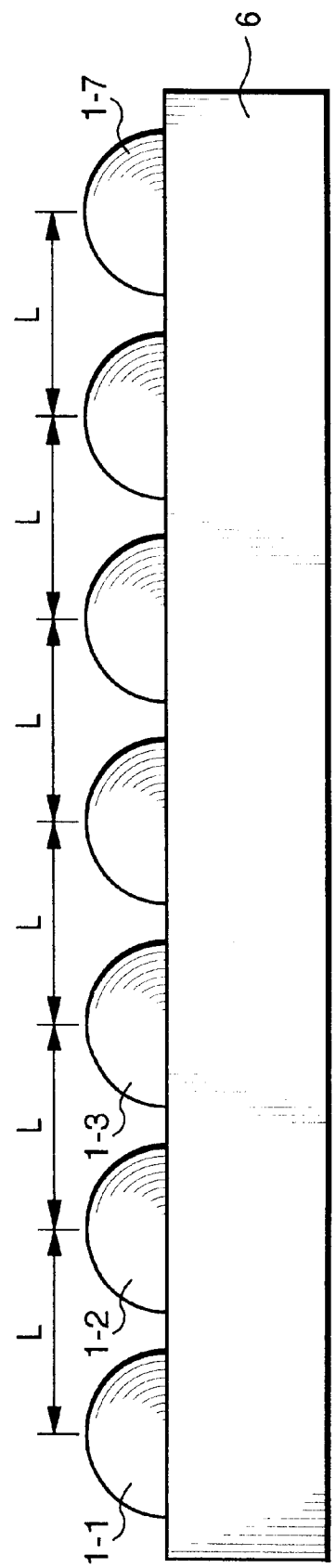
FIG. 5 is an explanatory view of the holder chucking the silicon balls.

As shown in FIG. 5, respective silicon balls 1 are held by a holder 6 by chucking their lower semispheres by a plurality of holes formed in the holder 6 at a predetermined interval L. In FIG. 5, one holder 6 holds seven silicon balls 1-1 to 1-7.

Figure 6:
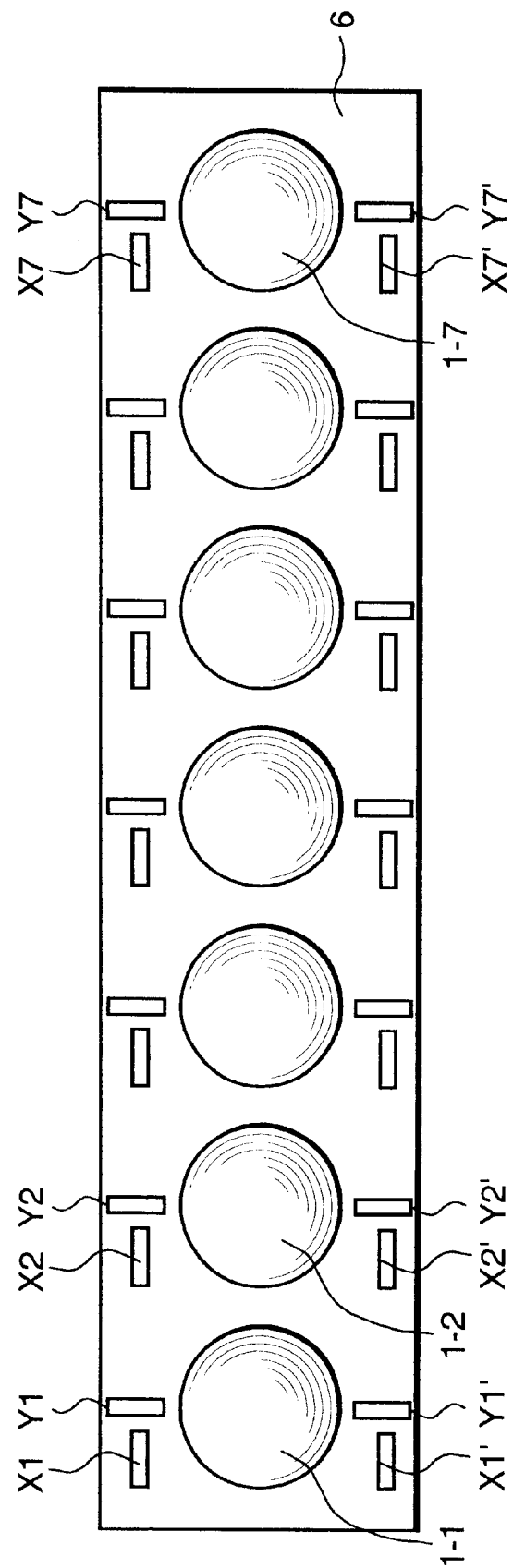
FIG. 6 is an explanatory view of the holder having a position detection mark.
Figure 7:
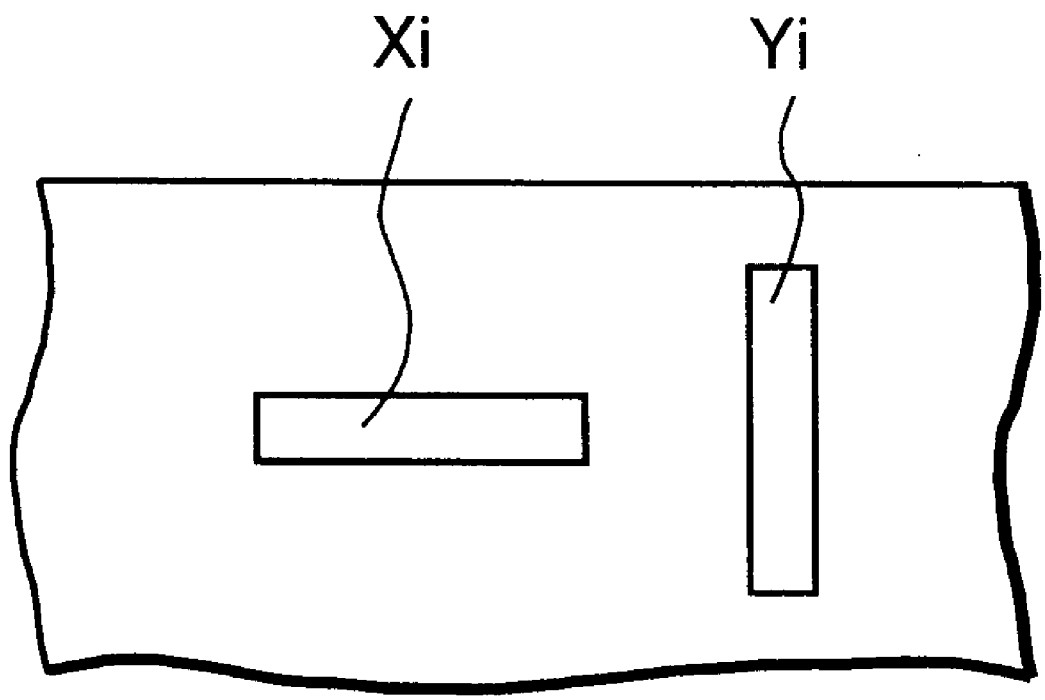
FIG. 7 is an explanatory view of position detection marks in the x and y directions.

As shown in FIG. 7, one position detection mark of the holder is made up of a pair of position detection marks Xi and Yi in the x and y directions. As shown in FIG. 6, the holder 6 has a pair of Xi and Yi (i=1 to 7) and a pair of Xi' and Yi' along the long sides of the holder 6 so as to sandwich a corresponding silicon ball 1.

Alignment of the silicon ball 1 using the position detection mark of the holder 6, and a subsequent pattern exposure process will be described with reference to FIGS. 8 to 15.

In FIGS. 8 to 15, a position detecting system 7 moves in a direction perpendicular to the sheet surfaces of FIGS. 8 to 15 to detect the position detection marks Xi, Yi, Xi', and Yi'. Alternatively, two position detecting systems 7 are arranged in a direction perpendicular to the sheet surfaces, one detects the position detection marks Xi and Yi, and the other detects the position detection marks Xi', and Yi'.

Figure 8:
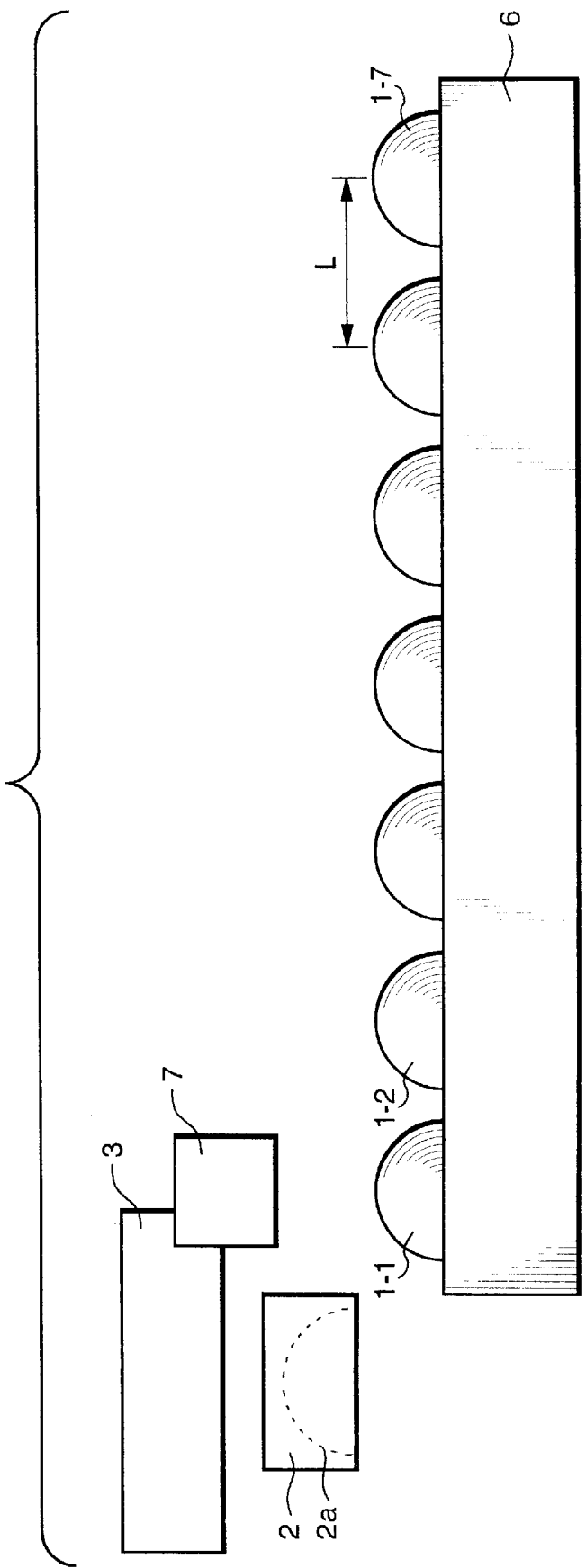
FIG. 8 is a view showing the arrangement of the holder and the exposure apparatus at the start.

FIG. 8 shows the arrangement (reference arrangement) of the holder 6 with respect to the exposure apparatus at the start of exposure.

FIG. 9 shows the state wherein the holder 6 is moved up, and the position detecting system 7 detects the position detection marks X1, Y1, X1', and Y1' of a holder portion for the leftmost silicon ball 1-1. When the position detecting system 7 detects the position detection marks, the distance between the silicon ball 1 corresponding to the detected position detection marks and the reticle 2 fixed to the exposure apparatus in the horizontal direction becomes equal to a distance L between adjacent silicon balls 1 held by the holder 6.

Figure 10:
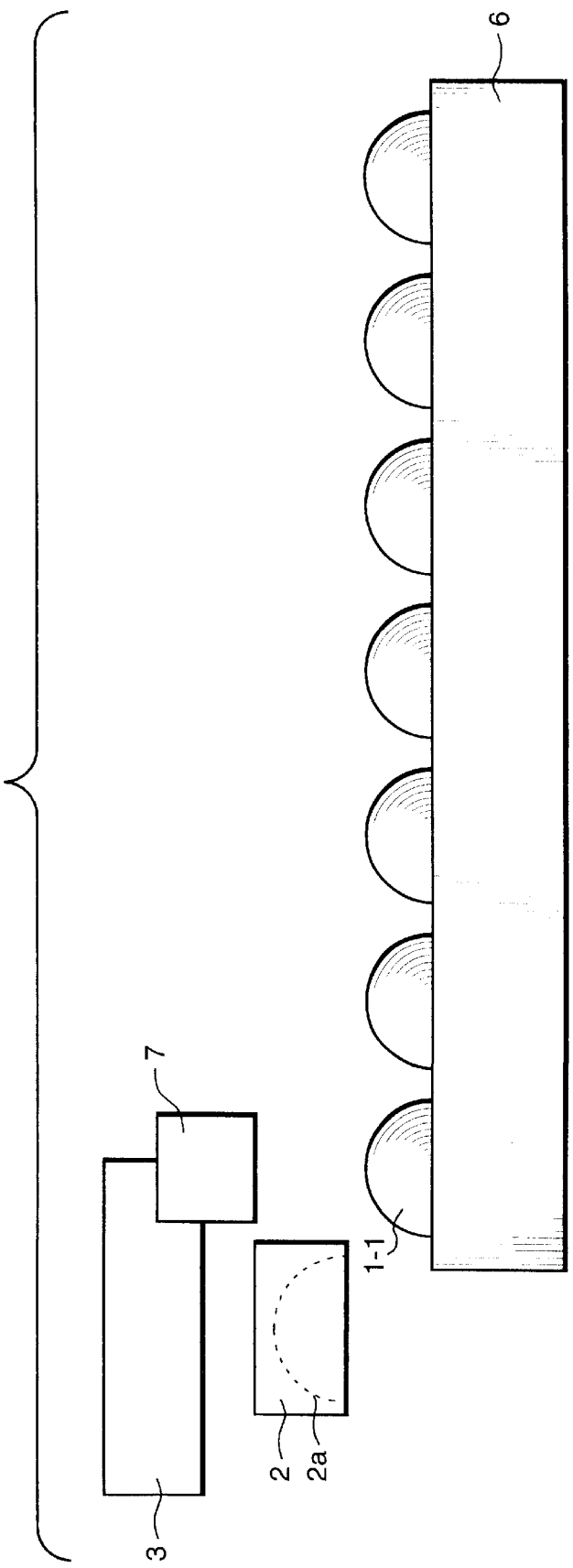
FIG. 10 is a view showing the state wherein the leftmost silicon ball is positioned down.

FIG. 10 shows the state wherein the holder 6 is moved down in order to move it to an exposure position (left in FIG. 10).

Figure 11:
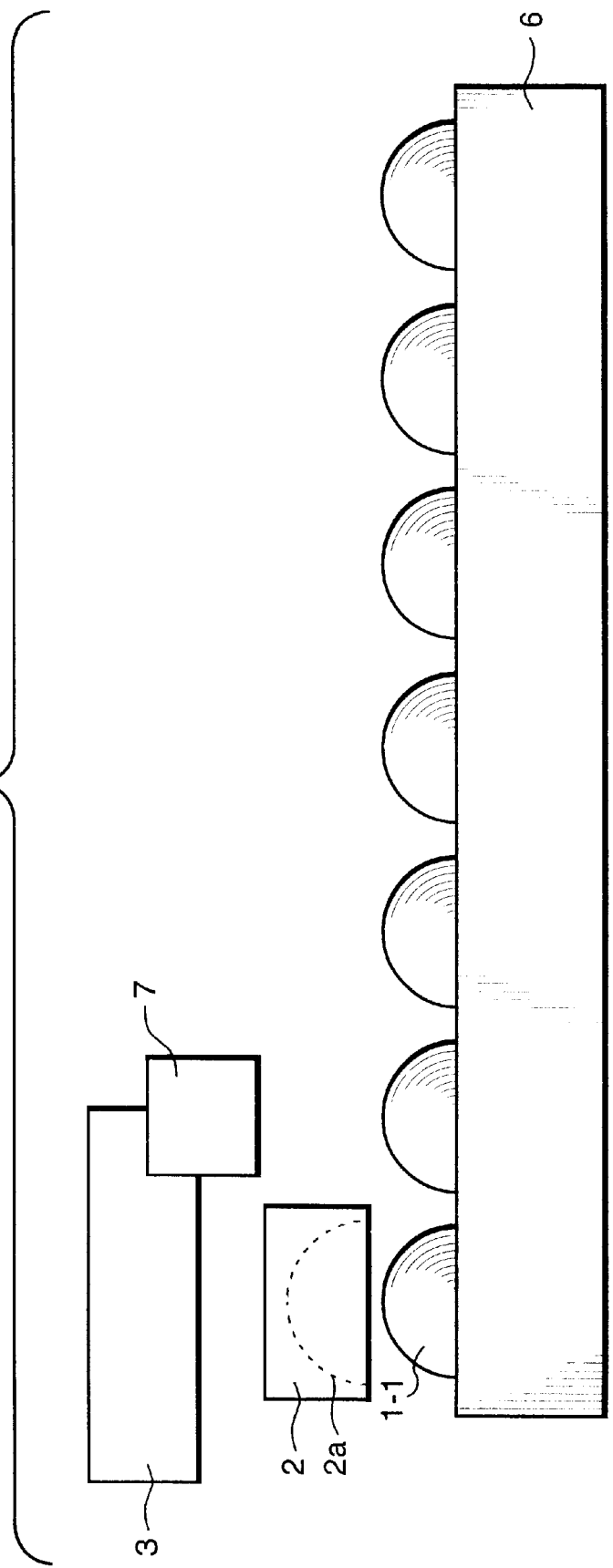
FIG. 11 is a view showing the state wherein the leftmost silicon ball is positioned below the exposure apparatus.

FIG. 11 shows the state wherein the holder 6 is moved relatively leftward in order to pattern-expose the leftmost silicon ball 1-1. The state in FIG. 11 is obtained by moving the holder 6 leftward from the position of the silicon ball 1-1 detected in FIG. 9 by the distance L between this position and the reticle 2.

Figure 12:
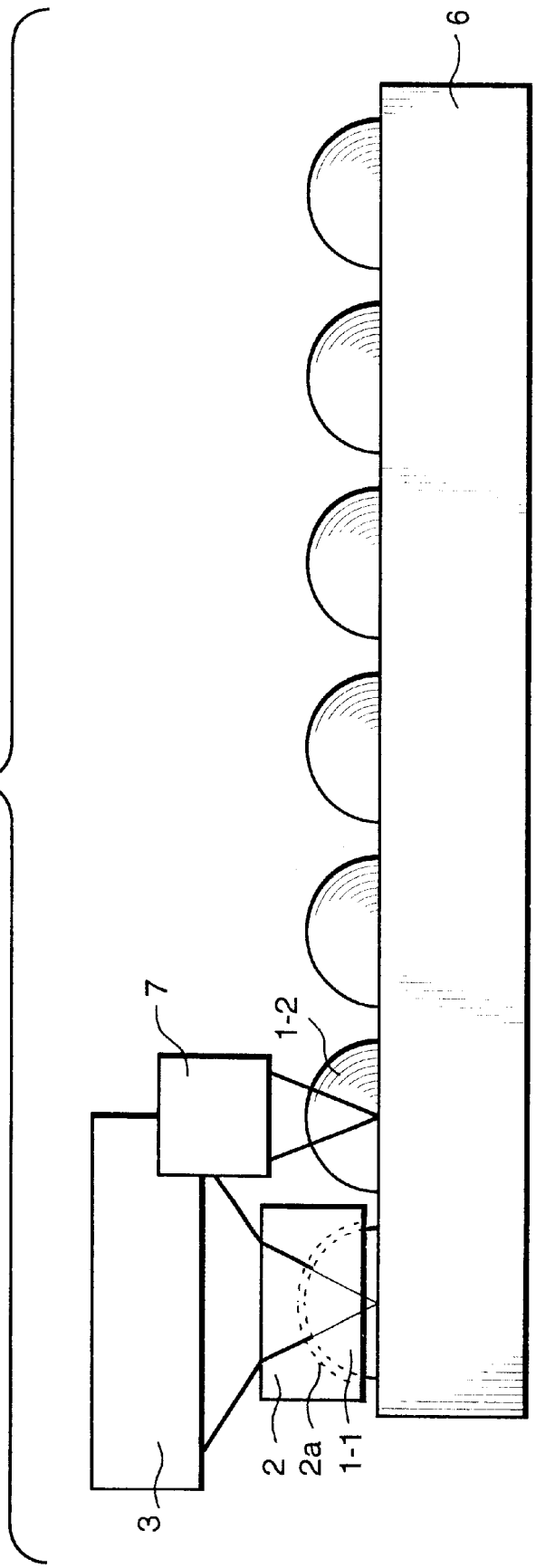
FIG. 12 is a view showing pattern exposure on the leftmost silicon ball and position detection of a portion of the holder near an adjacent silicon ball.

FIG. 12 shows the state wherein the holder 6 is moved up from the state in FIG. 11 in order to make the center of the ball of the circuit pattern surface 2a formed in the reticle 2 coincide with the center of the silicon ball 1-1. In this state, the surface of the silicon ball is pattern-exposed by projecting the pattern of the circuit pattern surface 2a on the surface of the leftmost silicon ball 1-1 by a light beam emitted by the illumination system 3 using, e.g., a Krf or ArF excimer laser as a light source. In this embodiment, while the silicon ball 1-1 is exposed, position detection marks X2, Y2, X2', and Y2' corresponding to the adjacent silicon ball 1-2 are detected. That is, at the same time as the exposure of the silicon ball 1-1, position detection equivalent to FIG. 9 is performed for the silicon ball 1-2.

Figure 13:
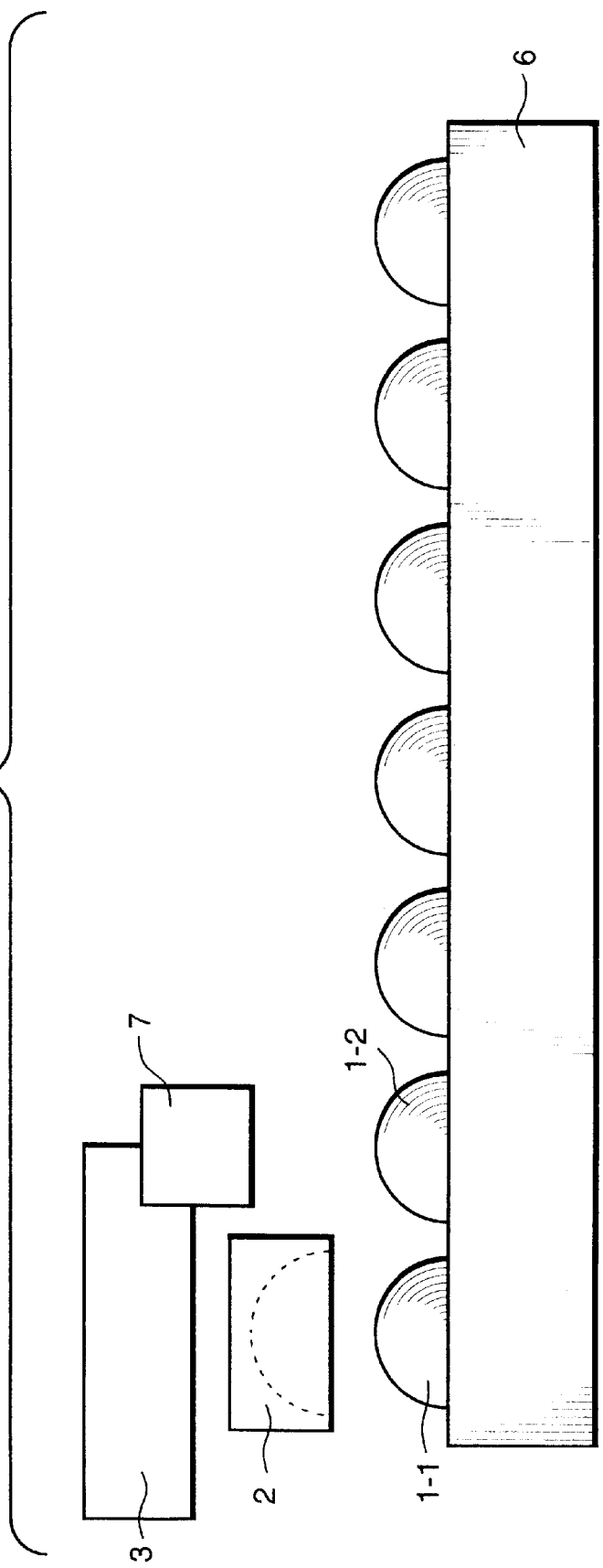
FIG. 13 is a view showing the state wherein the adjacent silicon ball is positioned down.

FIG. 13 is equivalent to FIG. 10, and shows the state wherein the holder 6 is moved down from the state in FIG. 12 in order to move it to the exposure position of the silicon ball 1-2.

Figure 14:
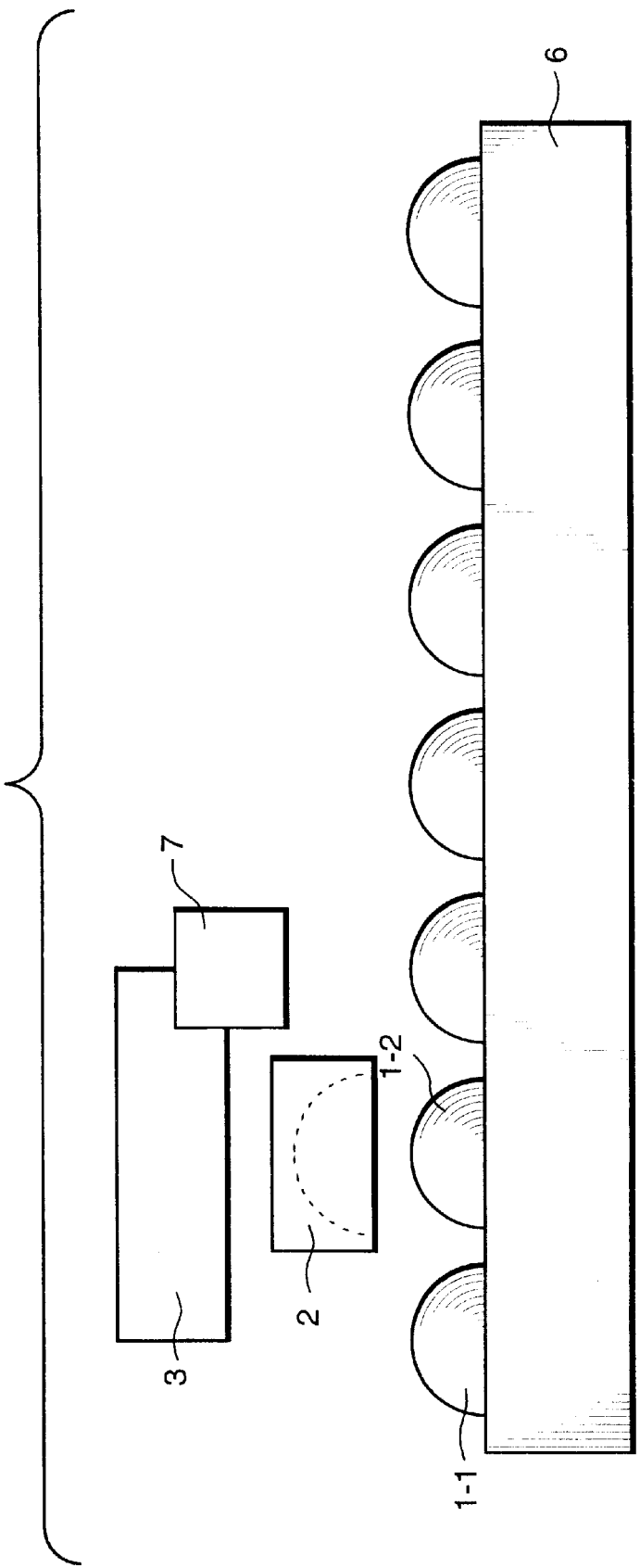
FIG. 14 is a view showing the state wherein the adjacent silicon ball is positioned below the exposure apparatus.

FIG. 14 is equivalent to FIG. 11, and shows the state wherein the holder 6 is moved relatively leftward in order to pattern-expose the silicon ball 1-2.

Figure 15:
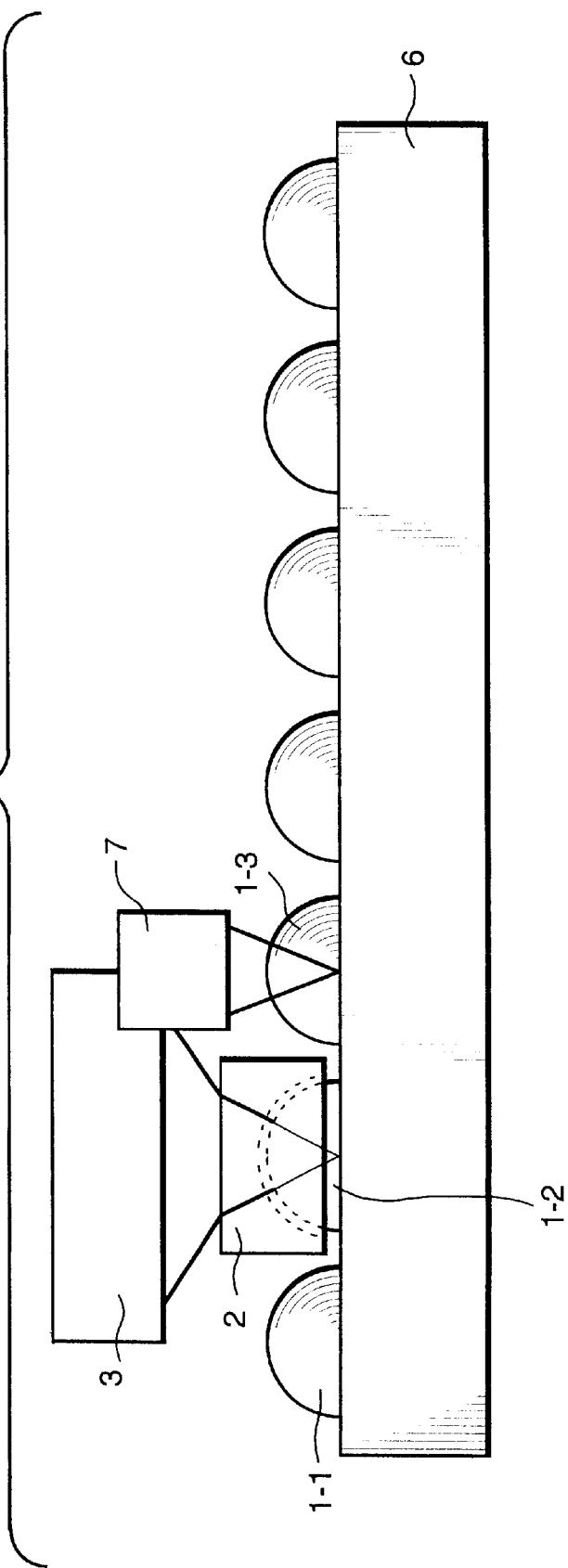
FIG. 15 is a view showing pattern exposure on the adjacent silicon ball.

FIG. 15 is equivalent to FIG. 12. The holder 6 is moved up, and the surface of the silicon ball 1-2 is pattern-exposed by projecting the circuit pattern of the circuit pattern surface 2a on the ball surface of the silicon ball 1-2 by a light beam emitted by the illumination system 3. At the same time, position detection marks X3, Y3, X3', and Y3' corresponding to the adjacent silicon ball 1-3 are detected.

In this manner, the upper semispheres of the silicon balls 1 are sequentially pattern-exposed.

If each silicon ball 1 is turned upside down and chucked by the holder 6 again, and the remaining semisphere is exposed, the entire surface of the silicon ball 1 is pattern-exposed.

Figure 16:
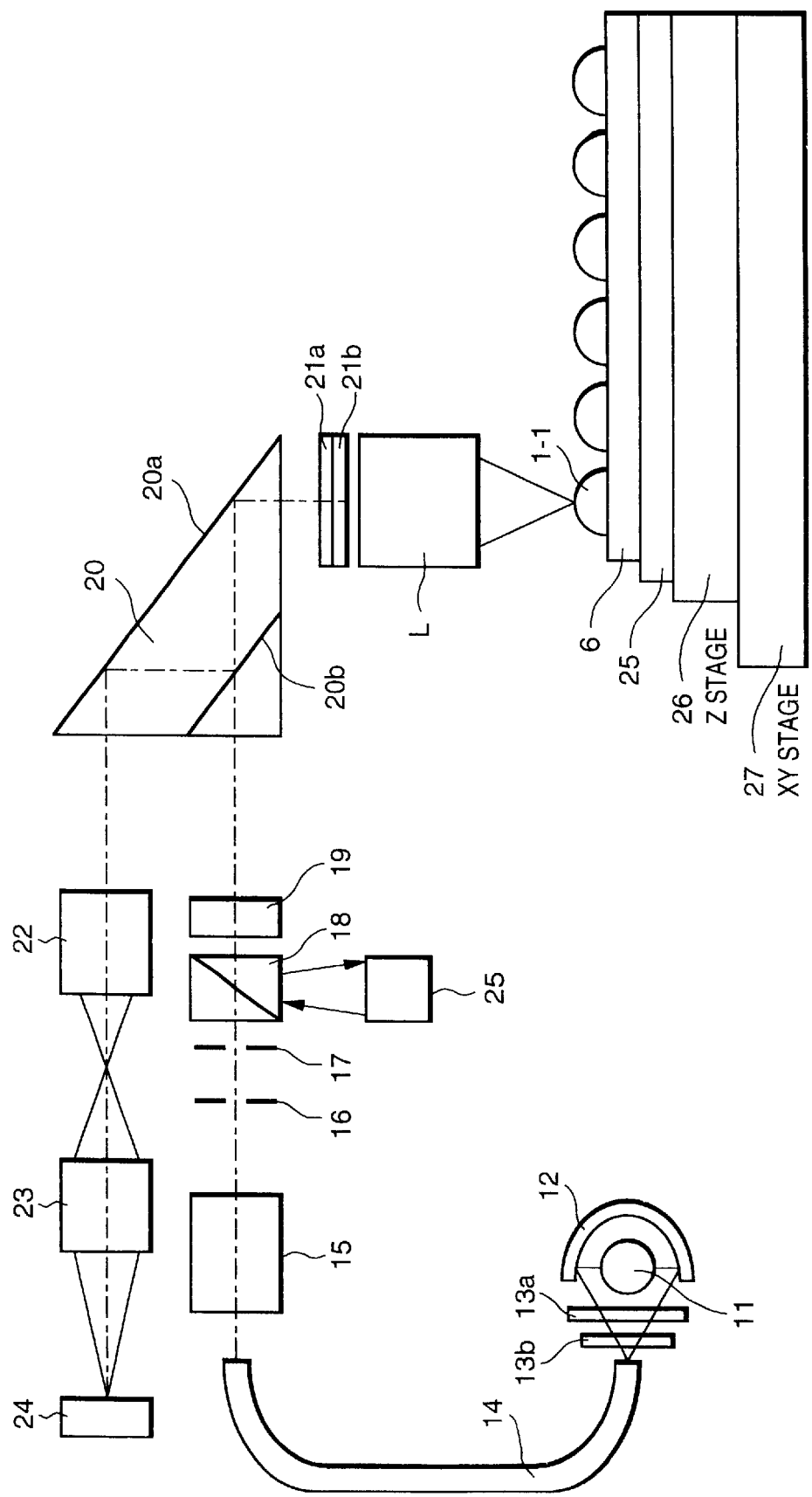
FIG. 16 is a view showing position detection near the top of the silicon ball by a three-dimensional position detecting system having a TTL detecting system.
Figure 17:
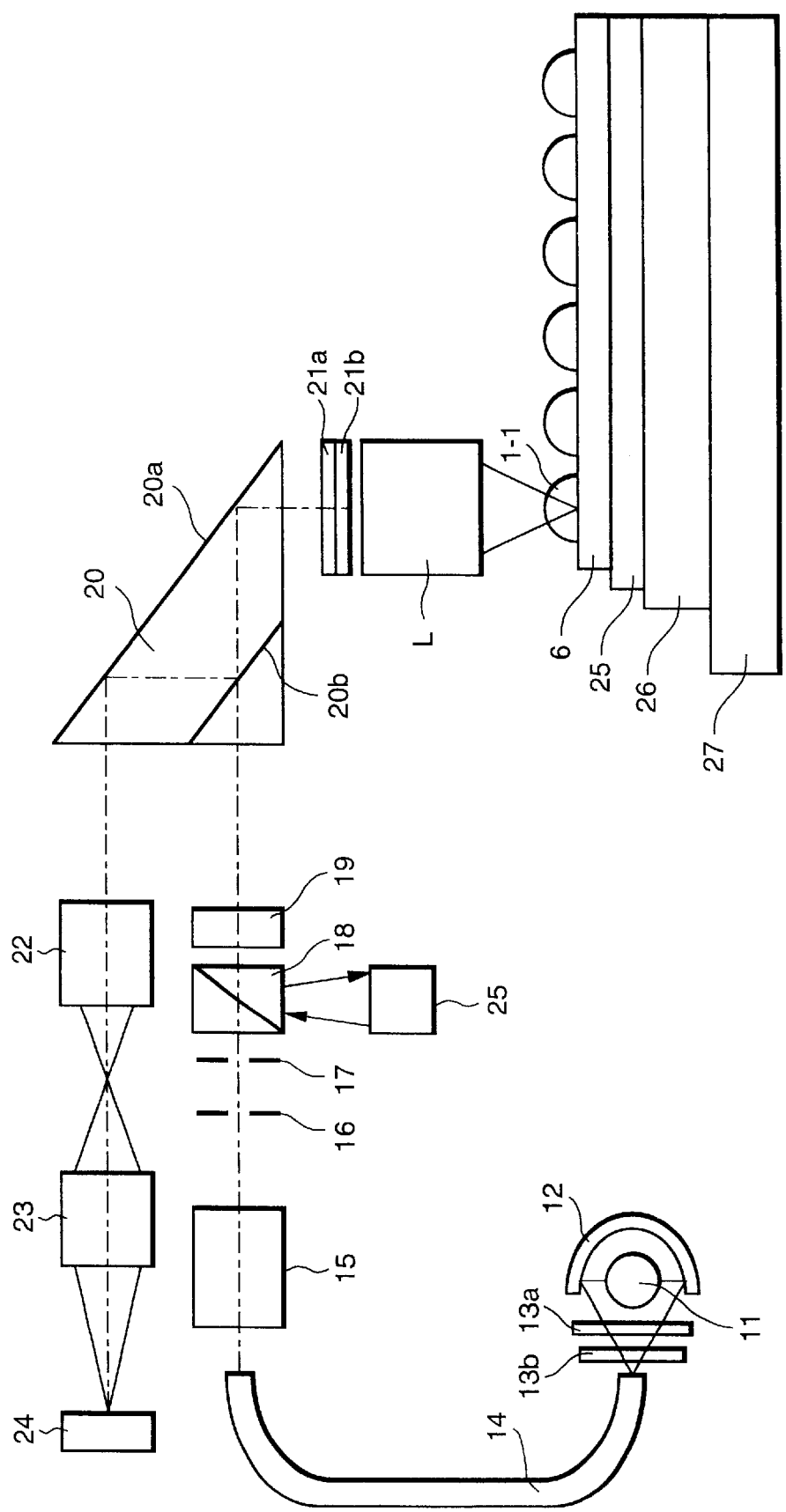
FIG. 17 is a view showing position detection of a portion of the holder near the silicon ball by the three-dimensional detecting system having the TTL detecting system.

FIGS. 16 and 17 show a system for measuring the relative positional relationship between the position detection mark of the holder 6 and the silicon ball 1 by a three-dimensional position detecting system.

In FIGS. 16 and 17, position detection is performed also in the z direction in addition to the x and y directions by a TTL detecting system including an objective lens L of the three-dimensional position detecting system. FIG. 16 shows a system for detecting a position detection mark near the top of the silicon ball 1. FIG. 17 shows a system for detecting a position detection mark near the holder 6.

In FIG. 17, position detection in the x and y directions is performed as follows.

A beam emitted by a halogen lamp 11 and a beam via a reflecting mirror 12 are wavelength-selected via wavelength selecting filters 13a (long-wavelength side) and 13b (short-wavelength side) to be incident on a fiber 14.

The beam passing through the exit end of the fiber 14 forms a light beam in the form of a field stop 17 on a portion of the holder 6 near the silicon ball 1 via a condenser lens 15, an aperture stop 16, the field stop 17, a dichroic mirror 18, an illumination system lens 19, an optical block 20, a quarter-wave plate (made up of 21b and 21b), and the objective lens L. If the light beam irradiates a position detection mark (see FIG. 7), the beam reflected by the irradiated position detection mark changes in polarized state via the objective lens L and the quarter-wave plate (made up of 21a and 21b). Accordingly, the beam is reflected by surfaces 20a and 20b of the optical block 20, and projected on a two-dimensional image sensing element 24 such as a CCD via a relay lens 22 and an erector lens 23. From the position of the image of the position detection mark projected on the two-dimensional image sensing element 24, positional shifts of the holder 6 in the x and y directions are detected. A pair of identical position detecting systems for the x and y directions are arranged in a direction perpendicular to the sheet surface of FIG. 17.

Position detection in the x and y directions in FIG. 16 is performed using a position detection mark (not shown) near the top of the silicon ball 1 in the same manner as in FIG. 17.

Position detection in the z direction will be explained with reference to FIG. 16.

A beam emitted by a z-direction detecting unit 25 is reflected by the dichroic mirror 18, and reaches the top of the ball surface of the silicon ball 1 via the illumination system lens 19, the optical block 20, the quarter-wave plate (made up of 21a and 21b), and the objective lens L. The beam is reflected by the top to return to the optical path, and reflected by the dichroic mirror 18 to be incident on the z-direction detecting unit 25 and impinge on an optical sensor. At this time, if the z-direction detecting unit 25 emits a beam such that the beam passing through the objective lens L is incident on the surface of a target object at an angle slightly different from a right angle, the reflected beam (image) impinges at a position on the sensor corresponding to the distance of the holder 6 in the z direction. As a result, a positional shift of the beam on the sensor is detected to perform z-direction position detection.

The dichroic mirror 18 has a function of passing through an xy-direction position detection light beam from the light source 11, and reflecting a z-direction position detection light beam from the detecting unit 25. The optical block 20 (surface 20b) functions as a polarization beam splitter for the xy-direction position detection light beam, and as a transmitting dichroic mirror for the z-direction position detection light beam.

Position detection in the z direction in FIG. 17 is similarly performed using the position detection mark of the holder 6. FIG. 17 shows the state wherein the holder 6 is moved up to detect the position detection marks X1, Y1, X1', and Y1' (see FIG. 6) corresponding to the leftmost silicon ball 1-1.

In FIGS. 16 and 17, the holder 6 is mounted via a chuck 25 on a Z-stage 26 movable in the z direction. The whole structure is mounted on an XY-stage 27 slidable in an XY plane.

Figure 18:
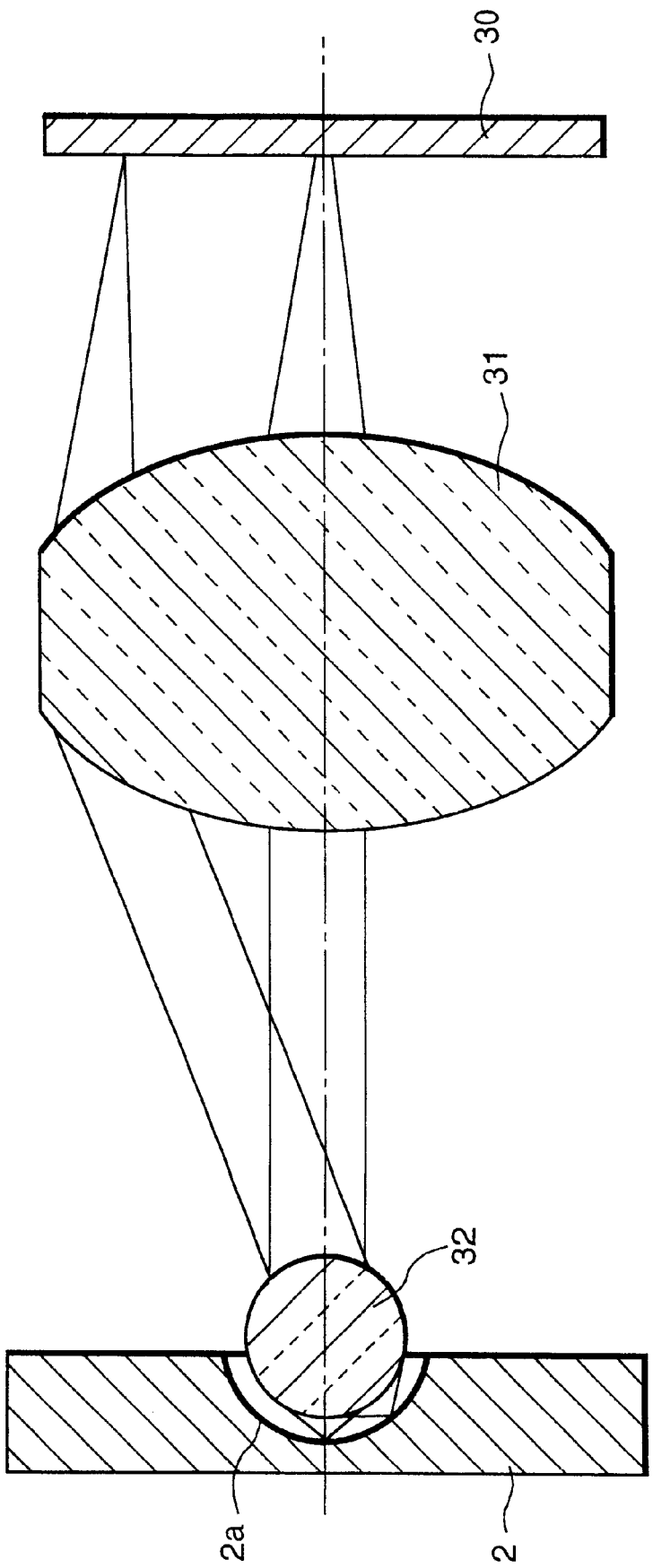
FIG. 18 is an explanatory view of a method of forming the circuit pattern of a reticle.

FIG. 18 shows a method of forming a circuit pattern on the circuit pattern surface 2a of the reticle 2.

A circuit pattern formed on a master mask 30 is projected without any aberration except for distortion on the circuit pattern surface 2a of the reticle 2 via a reduction lens 31 and a gradient index ball lens 32 serving as a transfer optical system.

The gradient index ball lens 32 for forming an image without any aberration (except for distortion) has already been applied by the present applicant (Japanese Patent Laid-Open No. 63-23118).

Although the circuit pattern of the master mask 30 is formed by an electron beam, a pattern for reversely correcting distortion which may occur in the transfer optical system must be formed.

FIG. 19 shows an example of dividing the upper semisphere of the silicon ball 1 into four regions, and pattern-exposing the regions sequentially (four times) without any boundary line, instead of simultaneously exposing the entire region of the upper semisphere.

FIG. 20 shows an example of dividing the upper semisphere of the silicon ball 1 into four regions, pattern-exposing the regions sequentially (four times) with boundary lines, and connecting adjacent regions by interconnections P.

As has been described above, according to the present invention, silicon balls can be simultaneously exposed using a reticle. A plurality of silicon balls held by the holder can be successively exposed. Therefore, a high-productivity exposure apparatus and ball-like device manufacturing method suitable for exposure in a process of manufacturing a ball-like device can be provided.

As many apparently widely different embodiments of the present invention can be made without departing from the spirit and scope thereof, it is to be understood that the invention is not limited to the specific embodiments thereof except as defined in the appended claims.

What is claimed is:

1. A ball-shaped device manufacturing method comprising the steps of:

arranging a ball-shaped device material having a surface, a geometric center, and a geometric diameter that extends from the surface to the center such that the geometric center of the ball-shaped device material corresponds with the geometric center of a ball-shaped area defined by a circuit pattern surface that is held in a position opposed to the surface of the ball-shaped device material, the geometric diameter of the ball-shaped area being greater than the geometric diameter of the ball-shaped device material, so as to provide a gap between the circuit pattern surface and the device material surface; and irradiating at least a portion of the surface of the ball-shaped device material, in a direction toward its geometric center, through the circuit pattern surface such that a circuit pattern is formed on the surface of the ball-shaped device material;

wherein said arranging step comprises aligning a holder using a position detection mark formed on the holder for holding the ball-shaped device material.

2. The method according to claim 1, wherein said arranging and irradiating steps are repeatedly performed for respective ball-shaped device materials held by the holder.

3. The method according to claim 1, further comprising a step of forming a circuit pattern on a ball-shaped surface of a reticle prior to said arranging step.

4. A method of aligning a ball-shaped device material, comprising the steps of:

holding at least one ball-shaped device material by a holder so that a predetermined positional relationship between the ball-shaped device material and the holder is maintained;

mounting the holder on an exposure apparatus;

detecting a position of the holder; and adjusting the position of the holder on the basis of the position detected in said detecting step so as to align the ball-shaped device material held by the holder.

5. The method according to claim 4, wherein the holder has at least one mark used for detecting the position of the holder in said detecting step.

6. A ball-shaped mask manufacturing apparatus for transferring a circuit pattern on a master mask to a ball-shaped mask, comprising:

an illumination system that provides a light beam illuminating the circuit pattern on the master mask;

a master mask holder arranged to hold the master mask;

a projection system including a gradient index lens, arranged to project the circuit pattern on the master mask onto the ball-shaped mask; and a ball-shaped mask holder arranged to hold the ball-shaped mask.

7. A ball-shaped mask manufacturing method for transferring a circuit pattern on a master mask to a ball-shaped mask, said method comprising the steps of:

holding the master mask;

holding the ball-shaped mask; and illuminating the circuit pattern on the master mask so as to project the circuit pattern on the master mask onto the ball-shaped mask through a gradient index lens.

\* \* \* \* \*

UNITED STATES PATENT AND TRADEMARK OFFICE
CERTIFICATE OF CORRECTION

PATENT NO. : 6,300,020 B1
DATED : October 9, 2001
INVENTOR(S) : Hideki Ina et al.

It is certified that error appears in the above-identified patent and that said Letters Patent is hereby corrected as shown below:

<u>Title page,</u>
References Cited, U.S. PATENT DOCUMENTS, "3,606,231" should read -- 3,603,231 --.

Signed and Sealed this

Twenty-third Day of April, 2002

Attest:

JAMES E. ROGAN
Attesting Officer     *Director of the United States Patent and Trademark Office*